(12) United States Patent
Hong

(10) Patent No.: US 10,936,421 B2
(45) Date of Patent: Mar. 2, 2021

(54) MEMORY SYSTEM HAVING STORAGE DEVICE AND MEMORY CONTROLLER AND OPERATING METHOD THEREOF

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 164 days.

(21) Appl. No.: 16/238,083

(22) Filed: Jan. 2, 2019

(65) Prior Publication Data

US 2019/0377641 A1 Dec. 12, 2019

(30) Foreign Application Priority Data

Jun. 12, 2018 (KR) .................. 10-2018-0067726

(51) Int. Cl.
| | |
|---|---|
| *G06F 11/00* | (2006.01) |
| *G06F 11/14* | (2006.01) |
| *G11C 16/10* | (2006.01) |
| *G11C 29/42* | (2006.01) |
| *G11C 16/34* | (2006.01) |

(52) U.S. Cl.
CPC .......... *G06F 11/141* (2013.01); *G06F 11/008* (2013.01); *G06F 11/1441* (2013.01); *G11C 16/10* (2013.01); *G11C 16/3431* (2013.01); *G11C 29/42* (2013.01); *G11C 16/3418* (2013.01); *G11C 16/3427* (2013.01)

(58) Field of Classification Search
CPC ............ G11C 16/3427; G11C 16/3431; G11C 16/3418; G06F 11/1438; G06F 11/1441
See application file for complete search history.

(56) References Cited

U.S. PATENT DOCUMENTS

| | | | | |
|---|---|---|---|---|
| 7,170,788 B1* | 1/2007 | Wan | ..................... | G11C 11/5628 365/185.14 |
| 2010/0329002 A1* | 12/2010 | Dong | .................. | G11C 16/3418 365/185.02 |
| 2011/0145487 A1* | 6/2011 | Haratsch | ................... | G11C 5/00 711/103 |
| 2014/0211563 A1* | 7/2014 | Chang | ................ | G11C 16/3459 365/185.03 |
| 2015/0078098 A1* | 3/2015 | Kwak | ..................... | G11C 16/08 365/185.25 |
| 2016/0103730 A1* | 4/2016 | Ke | .......................... | G06F 11/14 714/6.11 |
| 2016/0118131 A1* | 4/2016 | Dong | ....................... | G11C 7/04 365/185.02 |
| 2017/0147217 A1* | 5/2017 | Chang | .................... | G06F 3/0659 |
| 2017/0287568 A1* | 10/2017 | Yang | ................... | G11C 16/3431 |
| 2017/0358367 A1* | 12/2017 | Givant | ................... | G11C 16/10 |
| 2019/0377641 A1* | 12/2019 | Hong | ................... | G06F 11/1048 |

FOREIGN PATENT DOCUMENTS

| | | |
|---|---|---|
| KR | 1020150130638 | 11/2015 |
| KR | 1020170071126 | 6/2017 |

* cited by examiner

*Primary Examiner* — Jonathan D Gibson
(74) *Attorney, Agent, or Firm* — IP & T Group LLP

(57) ABSTRACT

A memory system includes: a storage device including a plurality pages for storing data; and a memory controller configured to determine, when sudden power-off occurs, whether there is a high probability of a program disturb of unselected pages sharing a word line coupled to a selected page among the pages in rebooting, and output a command to perform an over-write operation for programming data in the selected page or skip the over-write operation, based on a result of the determination.

21 Claims, 10 Drawing Sheets

MEMORY SYSTEM HAVING STORAGE DEVICE AND MEMORY CONTROLLER AND OPERATING METHOD THEREOF

CROSS-REFERENCE TO RELATED APPLICATION

The present application claims priority under 35 U.S.C. § 119(a) to Korean patent application number 10-2018-0067726, filed on Jun. 12, 2018, which is incorporated herein by reference in its entirety.

BACKGROUND

1. Field of Invention

The present disclosure generally relates to a memory system having a storage device and a memory controller and an operating method thereof and, more particularly, to a memory system employing a plurality of nonvolatile memory devices.

2. Description of Related Art

A memory system may include a storage device and a memory controller.

The storage device may include a plurality of memory devices for storing data. The memory devices may also output the stored data. For example, the memory devices may be configured as volatile memory devices in which stored data disappears when the supply of power is interrupted, or be configured as nonvolatile memory devices in which stored data is retained even when the supply of power is interrupted.

The memory controller may control data communication between a host and the storage device.

The host may communicate with the memory device through the memory controller by using an interface protocol such as Peripheral Component Interconnect-Express (PCI-e), Advanced Technology Attachment (ATA), Serial ATA (SATA), Parallel ATA (PATA), or Serial Attached SCSI (SAS). Interface protocols between the host and the memory system are not limited to the above-described examples, and may include various interfaces such as a Universal Serial Bus (USB), a Multi-Media Card (MMC), an Enhanced Small Disk Interface (ESDI), and Integrated Drive Electronics (IDE).

SUMMARY

Various embodiments of the present invention relate to a memory system having a storage device and a memory controller for controlling the storage device and, more particularly, to a memory system having a storage device which employs a plurality of nonvolatile memory devices. Various embodiments of the present invention also relate to an operating method of the inventive memory system.

Various embodiments of the present invention provide a memory system which is capable of performing or omitting an over-write operation after sudden power-off, based on a probability that a program disturb of memory cells will occur, and an operating method of the memory system.

In accordance with an aspect of the present disclosure, there is provided a memory system including: a storage device including a plurality pages for storing data; and a memory controller configured to determine, when sudden power-off occurs, whether there is a high probability of a program disturb of unselected pages sharing a word line coupled to a selected page among the pages in rebooting, and output a command to perform an over-write operation for programming data in the selected page or skip the over-write operation, based on a result of the determination.

In accordance with another aspect of the present disclosure, there is provided a method for operating a memory system, the method including: performing rebooting after sudden power-off; in the rebooting, determining whether a program disturb of unselected pages coupled to the same word line as a selected page in which data is stored has occurred; when it is determined that the program disturb has not occurred, performing an over-write operation of writing data in the selected page; and when it is determined that the program disturb has occurred, skipping the over-write operation of the selected page.

In accordance with still another aspect of the present disclosure, there is provided a method for operating a memory system, the method including: performing rebooting after sudden power-off; in the rebooting, determining whether a program disturb of unselected pages coupled to the same word line as a selected page in which data is stored has occurred according to a number of over-write operations performed on the selected page; when it is determined that the program disturb has not occurred, performing the over-write operation on the selected page; and when it is determined that the program disturb has occurred, newly selecting a page different from the selected page, and performing the over-write operation on the newly selected page.

In accordance with an another aspect of the present disclosure, there is provided a memory system including: a memory device including a plurality of pages; and a controller configured to control, when a write operation is interrupted to a first page among the pages due to a sudden power off, the memory device to perform an over-write operation to a second page, wherein the second page has neighboring pages sharing a word line therewith and the neighboring pages have a low probability of a program disturb, and wherein the controller selects a candidate page as the second page based on a result of a read operation to neighboring pages of the candidate page or based on a number of the over-write operations previously performed to the candidate page among the pages.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the present disclosure, advantages, features and methods for achieving them will become more apparent after a reading of the following exemplary embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may practice the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
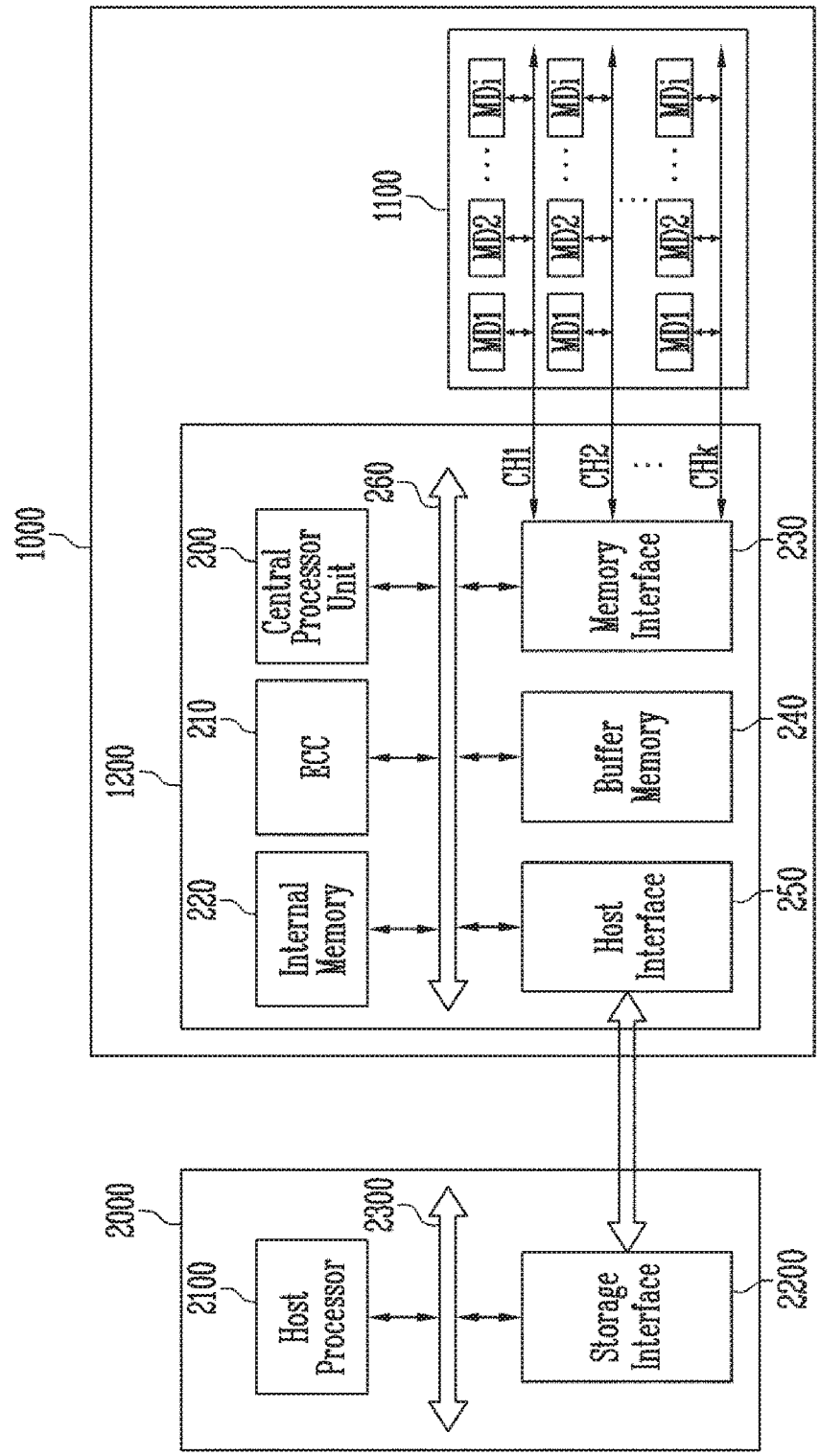
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may be coupled to a host 2000. The memory system 1000 may include a storage device 1100 for storing data and a memory controller 1200 for controlling the storage device and for enabling communication between the storage device 1100 and the host 2000.

The storage device 1100 may include a plurality of memory devices MD1 to MDi (i is a positive integer). For example, the memory devices MD1 to MDi may be implemented with volatile memory devices in which stored data disappears when the supply of power is interrupted or nonvolatile memory devices in which stored data is retained even when the supply of power is interrupted. FIG. 1 illustrates an embodiment in which the memory devices MD1 to MDi are implemented with nonvolatile memory devices. For example, the nonvolatile memory devices may be flash memory devices. The flash memory devices may be NAND or NOR flash memory devices.

The memory devices MD1 to MDi may be coupled to the memory controller 1200 through a plurality of channels CH1 to CHk. For example, first to kth channels CH1 to CHk may be coupled to the memory controller 1200, first to ith memory devices MD1 to MDi may be coupled to the first channel CH1, first to ith memory devices MD1 to MDi may be coupled to the second channel CH2, and first to ith memory devices MD1 to MDi may be coupled to the kth channel CHk. First to ith memory devices MD1 to MDi coupled to different channels CH1 to CHk are configured as physically different memory devices. For example, the first memory device MD1 coupled to the first channel CH1 is different from the first memory device MD1 coupled to the second channel CH2.

The memory controller 1200 may include a central processor unit (CPU) 200, an error correction circuit (ECC) 210, an internal memory 220, a memory interface 230, a buffer memory 240, and a host interface 250.

The CPU 200 may perform various operations (e.g., arithmetic calculations, logic operations) for controlling the storage device 1100, or generate a command and an address. In accordance with an embodiment of the present disclosure, when the memory system 1000 is rebooted after a sudden power-off, the CPU 200 may perform a sudden power-off recovery operation. A sudden power-off as this term is used herein means that the power of the memory system 1000 is suddenly down or off or that the supply of power is interrupted. The sudden power-off recovery operation may be an operation for returning the memory system 1000 to a status before the power of the memory system 1000 is turned off or for preventing an error caused by the sudden power-off when the memory system 1000 in which the sudden power-off occurs is rebooted. The sudden power-off recovery operation may include performing various operations. For example, the sudden power-off recovery operation may include performing at least one of an address map management operation, an over-write operation, and various debugging operations. An over-write operation refers to an operation of re-programming data in another page instead of reprogramming the data in a page in which the program operation was interrupted due to a sudden power-off.

When an over-write operation is repeated on a selected page, memory cells of unselected pages sharing word lines with the selected page may be repeatedly influenced by a program voltage. In particular, when the unselected pages are pages that have been completely programmed, a threshold voltage of the memory cells included in the unselected pages may be changed. For example, the threshold voltage of the memory cells may become higher than a target level due to the program voltage having a high voltage. That is, a program disturb may Occur.

In an embodiment, in order to prevent the program disturb, the CPU 200 may determine a status of the memory cells included in the unselected pages, and output a command to omit the over-write operation of the selected page when it is determined that the program disturb may occur. Therefore, a page coupled to another word line may be newly selected instead of the selected page, and the overwrite operation may be performed on the newly selected page. The CPU 200 may output commands for detecting a page having a program operation interrupted due to a sudden power-off (SPO), and for determining whether the unselected pages have a high probability of a program disturb when the program-interrupted page is detected.

The ECC 210 may detect an error of read data received from the storage device 1100, and correct the detected error. Also, the ECC 210 may count an error bit number by detecting an error of the read data.

The internal memory 220 may store various information necessary for an operation of the memory controller 1200. For example, the internal memory 220 may include logical and physical address map tables. The address map tables may be stored in the memory devices MD1 to MDi. When the memory system 1000 is booted, the address map tables stored in the memory devices MD1 to MDi may be re-loaded to the internal memory 220. The internal memory 220 may be configured with at least one of a Random-Access Memory (RAM), a Dynamic RAM (DRAM), a Static RAM (SRAM), a cache, and a Tightly Coupled Memory (TCM).

The memory interface 230 may exchange commands, addresses, data, and the like between the memory controller 1200 and the storage device 1100. For example, the memory interface 230 may transmit commands, addresses, data, and the like to the memory device MD1 to MDi through the first to kth channels CH1 to CHk, and receive data and the like from the memory devices MD1 to MDi.

The buffer memory 240 may temporarily store data in a program or read operation of the memory system 1000. For example, in a program operation of a selected memory device, the buffer memory 240 may temporarily store original program data until a program operation of the selected memory device passes. Also, in a read operation of a memory device, the buffer memory 240 may temporarily store data read from the memory device and then sequentially transmit the data to the host interface 250. In addition to the above-described data, system data such as address map tables may be stored in the buffer memory 240. The buffer memory 240 may be configured with a DRAM.

The host interface 250 may exchange commands, addresses, data, and the like between the memory controller 1200 and the host 2000. For example, the host interface 250 may receive a request, an address, data, and the like from the host 2000, and transmit data and the like to the host 2000. The CPU 200, the ECC 210, the internal memory 220, the memory interface 230, the buffer memory 240, and the host interface 250 may communicate with each other through a bus 260, also referred to herein as controller bus 260.

The host 2000 may include a host processor 2100 and a storage interface 2200. The host processor 2100 and the storage interface 2200 may communicate with each other through a bus 2300, also referred to herein as host bus 2300.

The host processor 2100 may generate a program request for a program operation of the memory system 1000 or a read request for a read operation of the memory system 1000. In addition, the host processor 2100 may generate various other operation requests including, for example, an erase request.

The storage interface 2200 may communicate with the memory system 1000 by using an interface protocol such as a Peripheral Component Interconnect express (PCIe), an Advanced Technology Attachment (ATA), a Serial ATA (SATA), a Parallel ATA (PATA), a Serial Attached SCSI (SAS) or a Non-Volatile Memory express (NVMe). The storage interface 2200 is not limited to the above-described examples, and may include various interfaces such as a Universal Serial Bus (USB), a Multi-Media Card (MMC), an Enhanced Small Disk Interface (ESDI), and an Integrated Drive Electronics (IDE).

Figure 2:
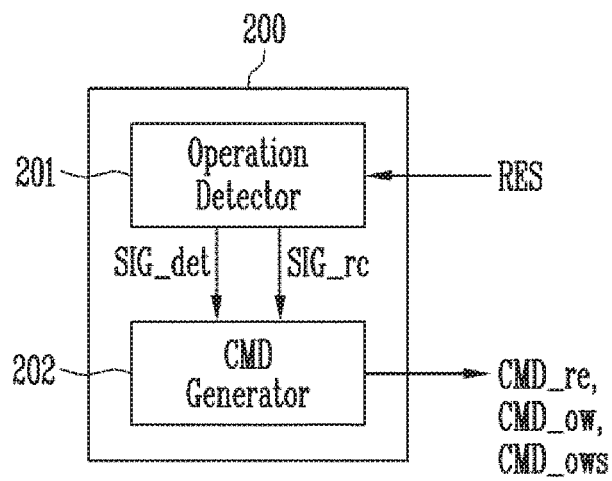
FIG. 2 is a diagram illustrating an embodiment of a central processor unit of FIG. 1.

FIG. 2 is a diagram illustrating an embodiment of the CPU 200 of FIG. 1.

Referring to FIG. 2, the CPU 200 may include an operation detector 201 and a command (CMD) generator 202.

The operation detector 201 may output a recovery signal SIG_rc or a determination signal SIG_det. The recovery signal SIG_rc may be a signal output to perform a recovery operation in a rebooting operation after a sudden power-off. The determination signal SIG_det may be a signal output based on a determination result of a probability that a program disturb of unselected pages will occur according to a status result value RES received from the storage device 1100.

For example, when the rebooting operation is started after a sudden power-off, the operation detector 201 may first output the recovery signal SIG_rc. When the status result value RES is received from the storage device 1100 in the recovery operation, the operation detector 201 may output the determination signal SIG_det, according to the status result value RES. When it is determined that the probability that the program disturb will occur exists based on the status result value RES, the operation detector 201 may output the determination signal SIG_det having a high level. When it is determined that the probability that the program disturb will occur does not exist based on the status result value RES, the operation detector 201 may output the determination signal SIG_det having a low level. The determination signal SIG_det may have different output values depending on a setting of the operation detector 201.

When the recovery signal SIG_rc is received, the CMD generator 202 may generate a read command CMD . . . re. When the determination signal SIG_det is received, the CMD generator 202 may generate and output an over-write command CMD_ow or an over-write skip command CMD_ows. In addition, the CMD generator 202 may generate and output various commands in response to a request from the host 2000 of FIG. 1.

The commands may include the read command CMD_re, the overwrite command CMD_ow and the overwrite skip command CMD_ows. The command output from the CMD generator 202 may be transmitted to a selected memory device through a selected channel. An address and data with respect to the selected memory device, a selected block, etc. may also be transmitted.

Figure 3:
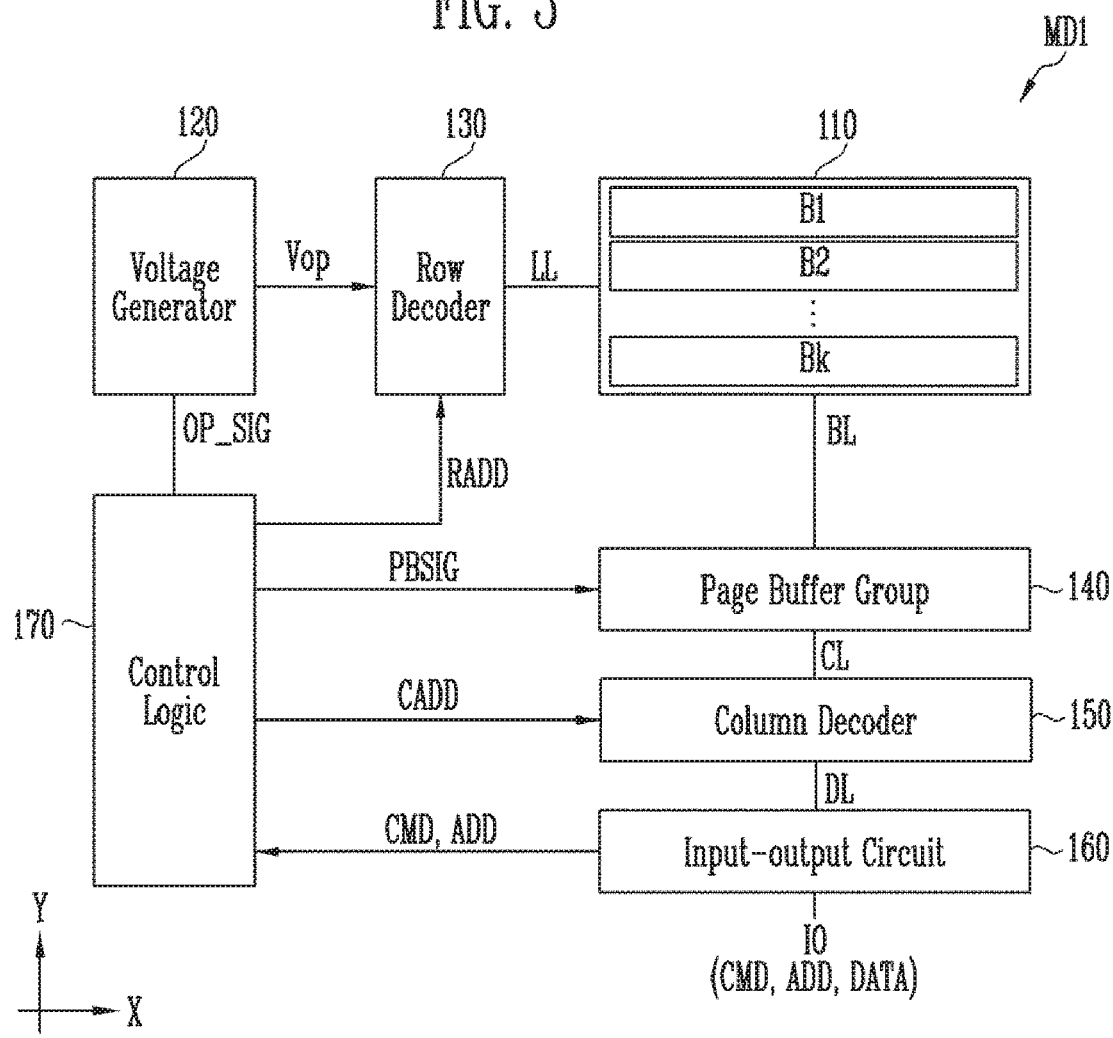
FIG. 3 is a diagram illustrating an example of a memory device of FIG. 1.

FIG. 3 is a diagram illustrating an example of the memory device of FIG. 1. The memory devices MD1 to MDi shown in FIG. 1 may be configured identically to one another. Therefore, in FIG. 3, any one memory device MD1 among the memory devices MD1 to MDi will be described in detail as an example.

Referring to FIG. 3, the memory device MD1 may include a memory cell array 110, a peripheral circuit configured to perform a program, read or erase operation, and a control logic 170 for controlling the peripheral circuit in response to a command. For example, the peripheral circuit may include a voltage generator 120, a row decoder 130, a page buffer group 140, a column decoder 150, and an input-output circuit 160.

The memory cell array 110 may include a plurality of memory blocks B1 to Bk (k is a positive integer). The memory blocks B1 to Bk include a plurality of memory cells, and may be implemented in a two- or three-dimensional structure. For example, in the memory blocks B1 to Bk having the two-dimensional structure, memory cells may be arranged in a horizontal direction above a substrate. In the memory blocks B1 to Bk having the three-dimensional structure, memory cells may be stacked in a vertical direction above a substrate.

The voltage generator 120 may generate and output operating voltages Vop necessary for each operation in response to operation signals OP_SIG. For example, when the operation signals OP_SIG are signals for a program operation, the voltage generator 120 may generate a program voltage, a pass voltage, a program verify voltage, and the like. When the operation signals OP_SIG are signals for a read operation, the voltage generator 120 may generate a read voltage, a pass voltage, and the like. When the operation signals OP_SIG are signals for an erase operation, the voltage generator 120 may generate an erase voltage, a pass voltage, an erase verify voltage, and the like.

The row decoder 130 may transfer the operating voltages Vop to a selected memory block through local lines LL in response to a row address RADD.

The page buffer group 140 may be coupled to the memory blocks B1 to Bk through bit lines BL, and include page buffers coupled to the respective bit lines BL. The bit lines BL may be arranged in a first direction X to be spaced apart from each other, and extend along a second direction Y. The page buffer group 140 may control voltages of the bit lines BL or sense voltages or currents of the bit lines BL in response to page control signals PBSIG.

The column decoder 150 may exchange data with the page buffer group 140 or exchange data with the input-output circuit 160 in response to a column address CADD. For example, the column decoder 150 may exchange data with the page buffer group 140 through column lines CL, or exchange data with the input-output circuit 160 through data lines DL.

The input-output circuit 160 may communicate with the memory controller 1200 through input-output lines 10. For example, the input-output circuit 160 may transfer a command CMD and an address ADD, which are received through the input-output lines 10, to the control logic 170, and transmit data DATA to the column decoder 150. Also, the input-output circuit 160 may output data DATA read from the memory blocks B1 to Bk to the memory controller 1200 through the input-output lines IO.

The control logic 170 may output control signals for controlling the peripheral circuit in response to the command CMD. The control signals may include the operation signals OP_SIG and the page buffer control signals PBSIG. Also, the control logic 170 may output the row address RADD and the column address CADD in response to the address ADD. The control logic 170 in accordance with this embodiment may check a status of unselected pages sharing a word line coupled to a selected page of a selected memory block before performing an over-write operation on the selected page in response to the command CMD. Also, the control logic 170 in accordance with this embodiment may omit the over-write operation on the selected page in response to the command CMD. When the over-write operation is omitted, the control logic 170 may perform an over-write operation on another page instead of the selected page. Also, the control logic 170 does not perform the over-write operation of the selected page but may perform an over-write operation on another page.

The above-described control logic 170 will be described in more detail as follows.

Figure 4:
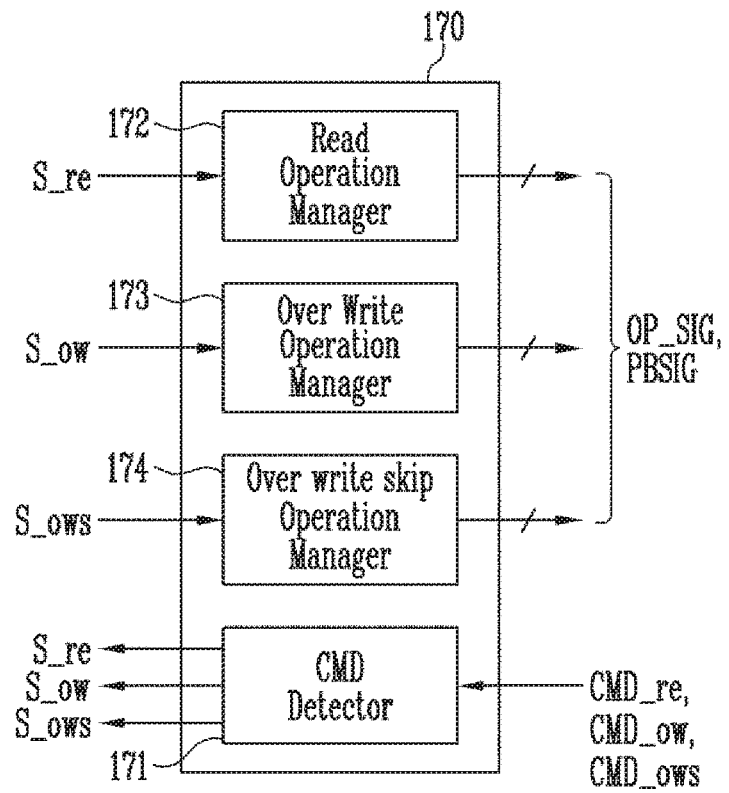
FIG. 4 is a diagram illustrating an embodiment of a control logic of FIG. 3.

FIG. 4 is a diagram illustrating an embodiment of the control logic 170 of FIG. 3.

Referring to FIG. 4, the control logic 170 may include a command (CMD) detector 171, a read operation manager 172, an over-write operation manager 173, and an over-write skip operation manager 174.

The CMD detector 171 may output a read signal S_re, an over-write signal S_ow or an over-write skip signal S_ows in response to a respective command CMD_re, CMD_ow or CMD_ows received from the memory controller 1200 of FIG. 1 such that an operation which corresponds on the received command is performed. For example, the CMD detector 171 may output a read signal S_re when the read command CMD_re is received, output an over-write signal S_ow when the over-write command CMD_ow is received, and output an over-write skip signal S_ows when an over-write skip command CMD_ows is received.

The read operation manager 172 may output operation signals OP_SIG and page buffer control signals PBSIG for performing a read operation in response to the read signal S_re. For example, the memory device MDk may perform a read operation of unselected pages sharing a word line coupled to a selected page in response to the operation signals OP_SIG and the page buffer control signals PBSIG, which are output from the read operation manager 172, and output a read result to the memory controller 1200.

The over-write operation manager 173 may output operation signals OP_SIG and page buffer control signals PBSIG for performing an over-write operation in response to the over-write signal S_ow. For example, the memory device MDk may perform an over-write operation of a selected page in response to the operation signals OP_SIG and the page buffer control signals PBSIG, which are output from the over-write operation manager 173.

The over-write skip operation manager 174 may output operation signals OP_SIG and page buffer control signals PBSIG for performing an over-write skip operation in response to the over-write skip signal S_ows. For example, the memory device MDk may omit an over-write operation of a selected page and perform an over-program operation on another selected page in response to the operation signals OP_SIG and the page buffer control signals PBSIG, which are output from the over-write skip operation manager 174. For example, when the operation signals OP_SIG and the page buffer control signals PBSIG are output from the read operation manager 172 before another page is newly selected, a read operation of unselected pages sharing a word line coupled to a page to be newly selected may be first performed. When it is determined that an over-write operation can be performed based on a read result, the corresponding page may be newly selected, and an over-write operation may be performed on the newly selected page.

Figure 5:
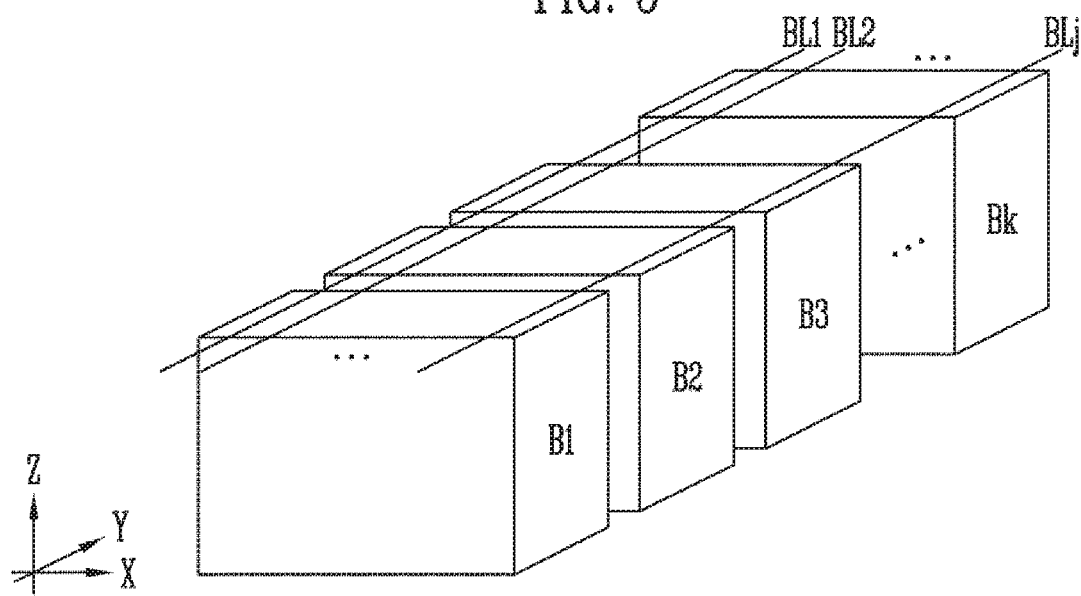
FIG. 5 is a diagram illustrating an example of three-dimensionally configured memory blocks.

FIG. 5 is a diagram illustrating three-dimensionally configured memory blocks.

Referring to FIG. 5, the three-dimensionally configured memory blocks B1 to Bk may be arranged along the direction Y in which bit lines BL1 to BLj extend to be spaced apart from each other. For example, first to kth memory blocks B1 to Bk may be arranged along the second direction Y to be spaced apart from each other, and include a plurality of memory cells stacked along a third direction Z. A configuration of any one memory block among the first to kth memory blocks B1 to Bk will be described in detail as follows.

Figure 6:
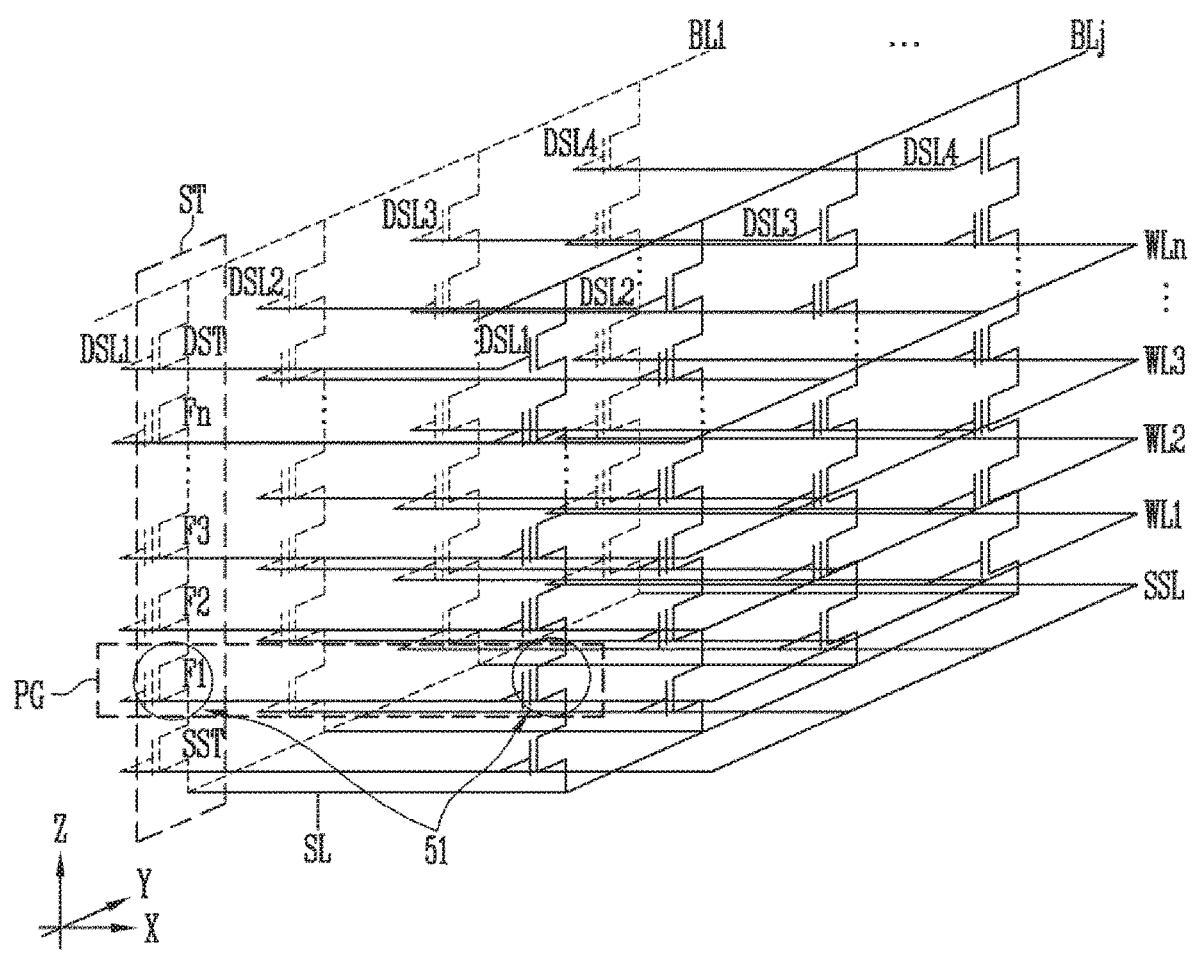
FIG. 6 is a circuit diagram illustrating an example of a memory block shown in FIG. 5.

FIG. 6 is a circuit diagram illustrating in detail any one memory block shown in FIG. 5.

Referring to FIG. 6, the memory block may include a plurality of strings ST each string including a plurality of memory cells. Each string ST may be coupled between a bit line and a source line SL. A string ST coupled between a first bit line BL1 and the source line SL will be described as an example.

The string ST may include a source select transistor SST, memory cells F1 to Fn (n is a positive integer), and a drain select transistor DST, which are coupled in series between the source line SL and the first bit line SL1. Gates of source select transistors SST included different strings coupled to different bit lines BL1 to BLj may be coupled to a source select line SSL, gates of memory cells F1 to Fn may be coupled to word lines WL1 to WLn, and gates of the drain select transistors DST may be coupled to drain select lines DSL1 to DSL4.

Among the drain select transistors DST, gates of transistors arranged in the first direction X1 are commonly coupled to the same drain select line, but transistors arranged in the second direction Y may be coupled to different drain select lines DSL2 to DSL4. For example, when assuming that drain select transistors DST are sequentially arranged along the second direction Y, gates of drain select transistors DST that are arranged in the first direction X from a first drain select transistor DST and are included in other strings ST may be coupled to a first drain select line DSL1. Drain select transistors DST arranged in the second direction Y from the drain select transistors DST coupled to the first drain select line DSL1 may be sequentially coupled to second to fourth drain select lines DSL2 to DSL4. Therefore, in a selected memory block, strings ST coupled to a selected drain select line may be selected, and strings ST coupled to the other unselected drain select lines may be unselected.

Groups of memory cells coupled to the same word line may constitute a plurality of pages PG. The page means a physical page. For example, among strings ST coupled to the first bit line BL1 to a jth bit line BLj, a group of memory cells 51 coupled in the first direction X to the same word line is referred to as a page PG. For example, among first memory cells F1 commonly coupled to a first word line WL1, memory cells arranged along the first direction X may constitute one page PG. Among the first memory cells F1 commonly coupled to the first word line WL1, memory cells arranged in the second direction Y may be divided into different pages. Therefore, when the first drain select line DSL1 is a selected drain select line and the first word line WL1 is a selected word line, a page coupled to the first drain select line DSL1 among a plurality of pages PG coupled to the first word line WL1 becomes a selected page. Pages that are commonly coupled to the first word line WL1 but are coupled to the unselected second to fourth drain select lines DSL2 to DSL4 become unselected pages.

Although a case where one source select transistor SST and one drain select transistor DST are included in each string ST is illustrated in the drawing, a plurality of source select transistors SST and a plurality of drain select transistors DST may be included in each string ST. Dummy cells may be included between the source select transistor SST, memory cells F1 to Fn, and the drain select transistor DST. The dummy cells do not store user data like general memory cells F1 to Fn, but may be used for some other purpose, e.g., for improving an electrical characteristic of each string ST. Dummy cells are not an important component of this embodiment and, therefore, detailed description thereof will be omitted.

Figure 7:
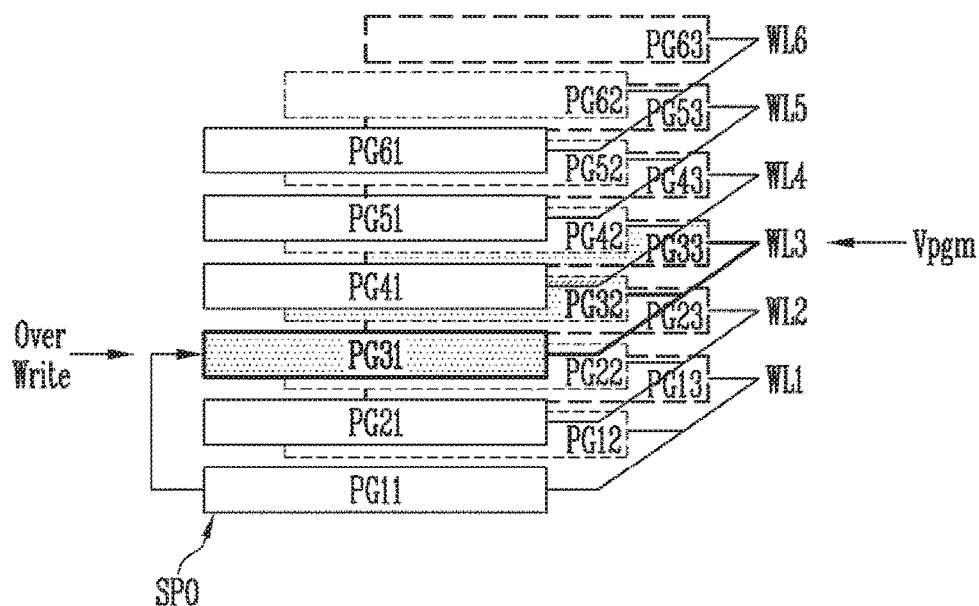
FIG. 7 is a diagram illustrating an example of an over-write operation.

FIG. 7 is a diagram illustrating an embodiment of an over-write operation.

Referring to FIG. 7, when a sudden power-off SPO occurs during a program operation of a page, another page may be selected in rebooting, and an over-write operation for re-writing data in the selected page may be performed.

For example, it is assumed that eleventh to sixty-first pages PG11 to PG61 are pages coupled to a first drain select line, twelfth to sixty-second pages PG12 to PG62 are pages coupled to a second drain select line, and thirteenth to sixty-third pages PG13 to PG63 are pages coupled to a third drain select line. When a sudden power-off SPO occurs during a program operation of the eleventh page PG11, the thirty-first page PG31 may be selected instead of the eleventh page PG11 in rebooting, and data to be programmed in the eleventh page PG11 may be re-written in the thirty-first page PG31. Another erased page among pages included in the string ST may be selected instead of the thirty-first page PG31 substituting for the eleventh page PG11.

When an over-write operation is performed on the thirty-first page PG31, a program voltage Vpgm may be applied to a third word line WL3 coupled to the thirty-first page PG31, and a pass voltage may be applied to the other word lines WL1, WL2, and WL4 to WL6. Since unselected thirty-second and thirty-third pages PG32 and PG33 as well as the thirty-first page PG31 are commonly coupled to the third word line WL3 to which the program voltage Vpgm is applied, memory cells included in the unselected thirty-second and thirty-third pages PG32 and PG33 may be influenced by the program voltage Vpgm. The channel voltage of strings included in the unselected thirty-second and thirty-third pages PG32 and PG33 is highly boosted, and hence increase of the threshold voltage of the memory cells included in the unselected thirty-second and thirty-third pages PG32 and PG33 is suppressed. However, when the over-write operation is repeated to the thirty-first page PG31, the threshold voltage of the memory cells included in the unselected thirty-second and thirty-third pages PG32 and PG33 may be gradually increased due to the influence on the program voltage Vpgm. In particular, when the threshold voltage of memory cells of which program operation is completed is gradually increased, a program disturb may occur, and therefore, error correction may be impossible because the number of error bits may increase substantially in a read operation. The phenomenon that the threshold voltage of memory cells included in unselected pages is increased will be described in more detail as follows.

Figure 8:
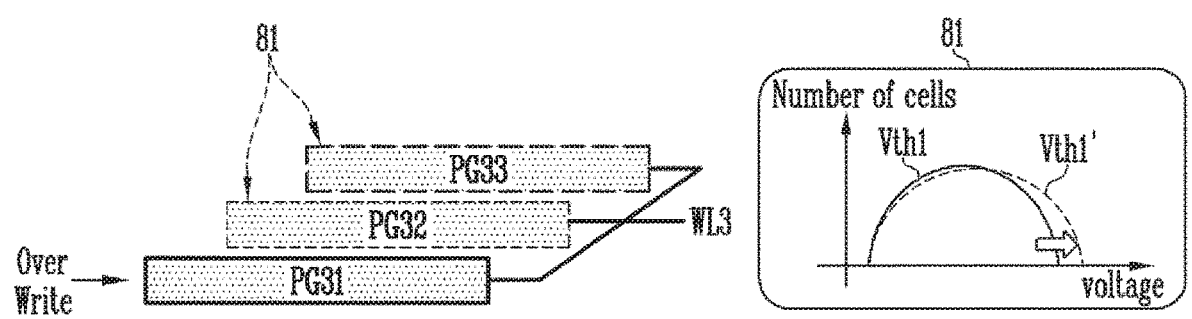
FIG. 8 is a diagram illustrating an example of a change in a threshold voltage of memory cells due to an over-write operation.

FIG. 8 is a diagram illustrating a change in the threshold voltage of memory cells due to an over-write operation. Only the pages coupled to the selected word line WL3 among the pages shown in FIG. 7 is illustrated in FIG. 8.

Referring to FIG. 8, unselected pages 81 coupled to the third word line WL3, e.g., the thirty-second and thirty-third pages PG32 and PG33 may be influenced by the program voltage Vpgm applied to the third word line WL3. For example, the threshold voltage Vth1 of memory cells included in the thirty-second and thirty-third pages PG32 and PG33 may be gradually increased to the threshold voltage Vth1' whenever the over-write operation of the thirty-first page PG31 is repeated. When the threshold voltage of programmed memory cells is increased as described above, an error may occur when the distance between different threshold voltage distributions is narrowed in a memory device having a plurality of threshold voltage distributions of memory cells such as multi-level cells (MLCs).

For addressing this concern, in accordance with an embodiment of the present disclosure, a first determination is made of the probability that a program disturb of unselected pages, which share the same wordline with a candidate selected page, will occur, and then based on the determined probability a second determination is made of whether or not to perform the over-write operation on the candidate selected page.

Figure 9:
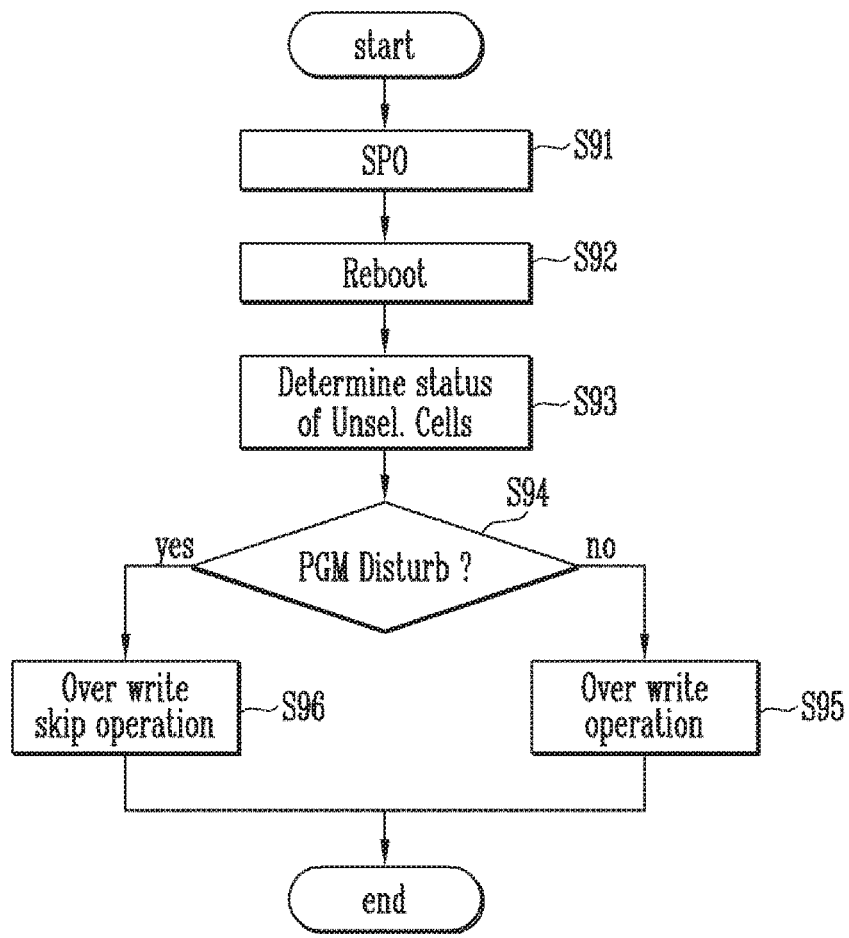
FIG. 9 is a flowchart illustrating an operating method of a memory system in accordance with an embodiment of the present disclosure.

FIG. 9 is a flowchart illustrating an operating method of the memory system 1000 in accordance with an embodiment of the present disclosure.

Referring to FIG. 9, when a sudden power-off SPO occurs at step S91 while the memory system 1000 is operating, the memory system 1000 may be rebooted at step S92.

When the memory system 1000 is rebooted, the memory controller 1200 included in the memory system 1000 may determine a status of unselected pages before an over-write operation of a selected page is performed at step S93. For example, the memory controller 1200 may generate a command for determining a status of unselected memory cells Unsel. Cells included in the unselected pages, and transmit the generated command to a selected memory device. The selected memory device may perform an operation for determining the status of the memory cells in response to the received command, and output a status result value to the memory controller 1200.

The memory controller 1200 may determine a probability that a program disturb of the unselected memory cells occurs based on the status result value received from the memory device at step S94.

In the step S94, when it is determined that the probability that the program disturb of the unselected memory cells will occur does not exist (no), the memory controller 1200 may output a command such that the over-write operation of the selected page is performed at step S95.

In the step S94, when it is determined that the probability that the program disturb of the unselected memory cells will occur exists (yes), the memory controller 1200 may output a command for skipping the over-write operation of the selected page at step S96.

Among the above-described steps, the step S93 of determining the status of the unselected memory cells Unsel. Cells will be described in detail as follows.

Figure 10:
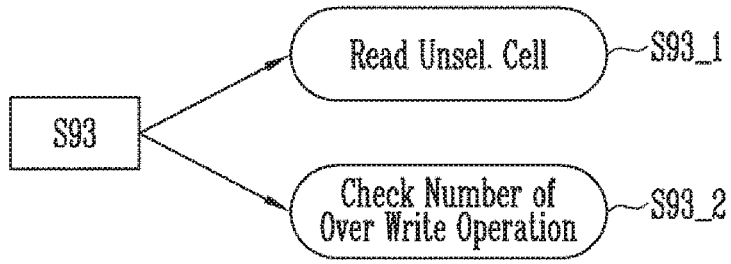
FIG. 10 is a diagram illustrating a step of determining a status of unselected memory cells of the operating method of FIG. 9.

FIG. 10 is a diagram illustrating the step S93 of determining the status of the unselected memory cells.

Referring to FIG. 10, the step S93 of determining the status of the unselected memory cells may be performed using various methods. For example, the memory controller may determine a number of memory cells of which threshold voltages are changed by reading the unselected memory cells Unsel. Cells at step S93_0.1. That is, when the number of memory cells included in unselected pages, which of threshold voltages are higher than a reference voltage, is larger than or equal to a set number due to an over-write operation of the selected page, the memory controller may determine that a program disturb will occur in the unselected pages coupled to the selected word line. Therefore, the step S96 of FIG. 9 may be performed. When the number of memory cells having threshold voltages higher than the reference voltage is smaller than the set number, the memory controller may determine that the program disturb will not occur in the corresponding pages. Therefore, the step S95 of FIG. 9 may be performed.

In another embodiment, the memory controller may determine a probability that the program disturb will occur by checking a number of over-write operations performed in the selected page at step S93_2. For example, when the number of over-write operations performed in the selected page is larger than or equal to a reference number, the memory controller may determine that the program disturb will occur in the unselected pages coupled to the selected word line. Therefore, the step S96 of FIG. 9 will be performed. When the number of over-write operations is smaller than the reference number, the memory controller may determine that the program disturb will not occur in the corresponding pages. Therefore, the step S95 of FIG. 9 may be performed.

Among the above-described methods, the step S93_1 of reading the unselected cells may be performed in accordance with various embodiments.

Figure 11:
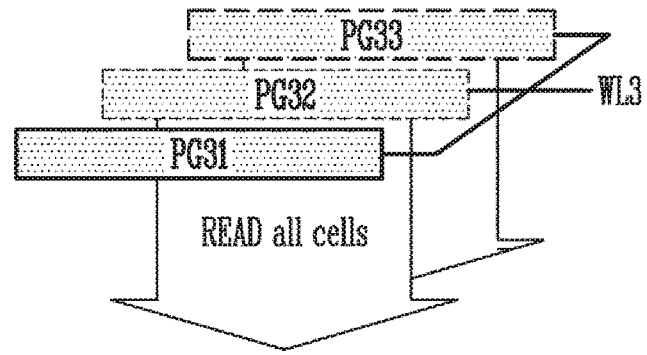
FIGS. 11 to 13 are diagrams illustrating examples of a read 5F operation of unselected pages.
Figure 12:
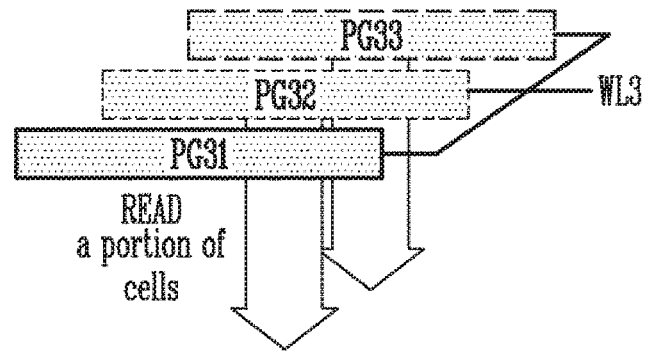
Figure 13:
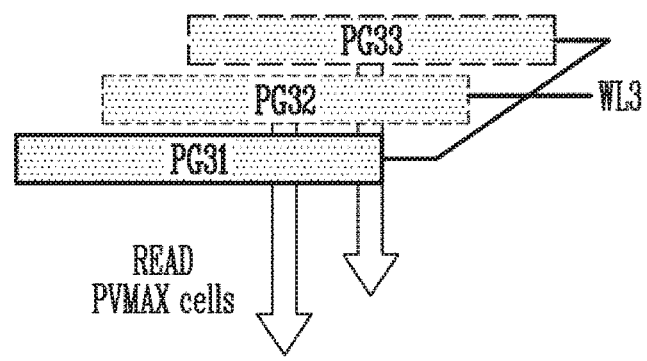

FIGS. 11 to 13 are diagrams illustrating embodiments of a read operation of unselected pages. Each embodiment will be described by assuming that the thirty-first page PG31 is a selected page and the thirty-second and thirty-third pages PG32 and PG33 are unselected pages.

Referring to FIG. 11, a read operation for determining a program disturb of unselected pages may be performed on all memory cells included in the unselected pages. This embodiment is referred to as the READ all cells embodiment. In other words, the read operation may be performed on all threshold voltage distribution sections. For example, in multi-level cells (MLCs) each storing two bits, the threshold voltage distribution of the memory cells may be divided into an erase status, a first program status, a second program status, and a third program status. The read operation for determining the program disturb may be performed on each of the first to third program statuses. For example, the read operation may be performed on memory cells programmed to the first program status, be performed on memory cells programmed to the second program status, and be performed on memory cells programmed to the third program status. The read operation may also be applied to a scheme in which three or more bits are stored in one memory cell, such as a triple level cell (TLC) or a quadruple level cell (QLC).

The memory controller may receive read data as a status result value, and determine a probability that the program disturb will occur by counting an error bit number from the status result value. The error bit number may be counted through the ECC 210 of FIG. 1, which is included in the memory controller.

The read operation may be performed using, as a read voltage, a voltage that is slightly higher than the maximum level of each threshold voltage distribution. For example, for MLCs each storing two bits, the read operation may be performed for the first program status, with a read voltage that is slightly higher than the maximum level of the threshold voltage distribution for the first program status. The read operation may be performed for the second program status, with a read voltage that is slightly higher than the maximum level of the threshold voltage distribution for the second program status. The read operation may be performed for the third program status, with a read voltage that is slightly higher than the maximum level of the threshold voltage distribution for the third program status.

Referring to FIG. 12, a read operation for determining a program disturb of unselected pages may be performed only on a portion of memory cells (READ a portion of cells embodiment). In other words, the read operation may be performed on a portion of threshold voltage distribution sections, which the portion of the memory cells may have. For example, in the case of MLCs, the read operation may be performed on the first and second program statuses, be performed on the second and third program statuses, or be performed on the first and third program statuses. That is, the read operation may be performed not using all read voltages corresponding to all the program statuses but using a portion of the read voltages. When the read operation is performed on the all the program statuses as described in FIG. 11, the time required to perform the read operation is greater than the time required for performing the read operation on only a portion of the cells. In accordance with the embodiment of FIG. 12, the read operation may be performed on fewer than all the program statuses and on at least two of the program statuses.

Referring to FIG. 13, a read operation for determining a program disturb of unselected pages may be performed only on memory cells programmed to the highest program status (READ PVMAX cells embodiment). In other words, the read operation may be performed using only a read voltage corresponding to the highest program status. For example, in the above example of MLCs, the read operation may be performed on the third program status only. When the read operation is performed on all the program statuses or a portion of the program statuses as shown in the embodiments of FIG. 11 or 12, the time required to perform the read operation is greater than the time required to perform the read operation only on the highest program status. In the embodiment of FIG. 13, the read operation may be performed only on the highest program status.

Figure 14:
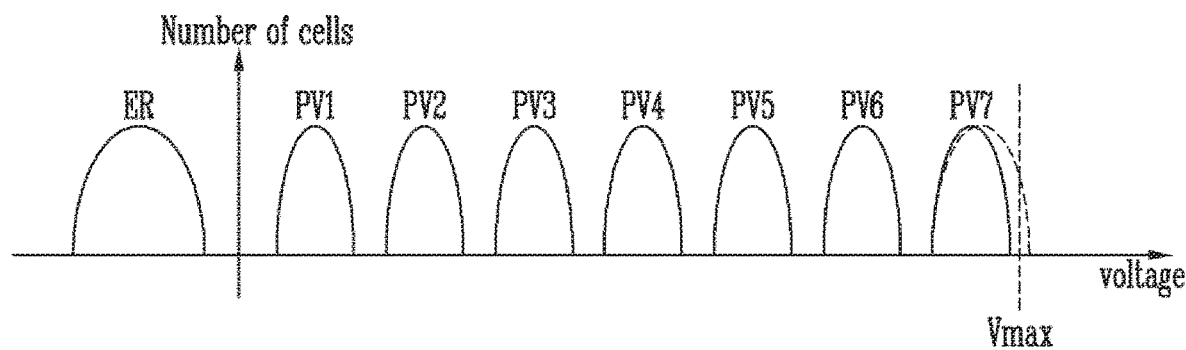
FIG. 14 is a diagram illustrating in detail an example of determining a status of memory cells having the highest threshold voltage.

FIG. 14 is a diagram illustrating in detail an embodiment of determining a status of memory cells having the highest threshold voltage.

In FIG. 14, TLCs will be described as an example.

In the TLCs, memory cells may be programmed to an erase status ER or any one of and seven program statuses PV1 to PV7. For example, the status of the programmed memory cells may be any one status among the first to seventh program statuses PV1 to PV7. Among the first to seventh program statuses PV1 to PV7, the first program status PV1 may be a status in which the memory cells are programmed to have the lowest threshold voltage, and the seventh program status PV7 may be a status in which the memory cells are programmed to have the highest threshold voltage. Therefore, as described in the embodiment of FIG. 13, the memory cells programmed to the highest program status may be memory cells programmed to the seventh program status PV7.

Since the read operation for determining the program disturb is performed to search for memory cells of which threshold voltages are increased, a read voltage Vmax may be set based on the highest voltage in a threshold voltage distribution of a selected program status. For example, when it is determined that the threshold voltages are all lower than the set read voltage Vmax as a result obtained by performing a read operation using the read voltage Vmax, it may be determined that the program disturb has not occurred in the corresponding page. Alternatively, when memory cells of which threshold voltages are higher than the read voltage Vmax are detected, it may be determined that the program disturb has occurred in the corresponding page.

The memory controller can receive, as a status read value, data read using any one of the above-described embodiments, and determine whether a program disturb of unselected pages has occurred based on the input status result value.

Figure 15:
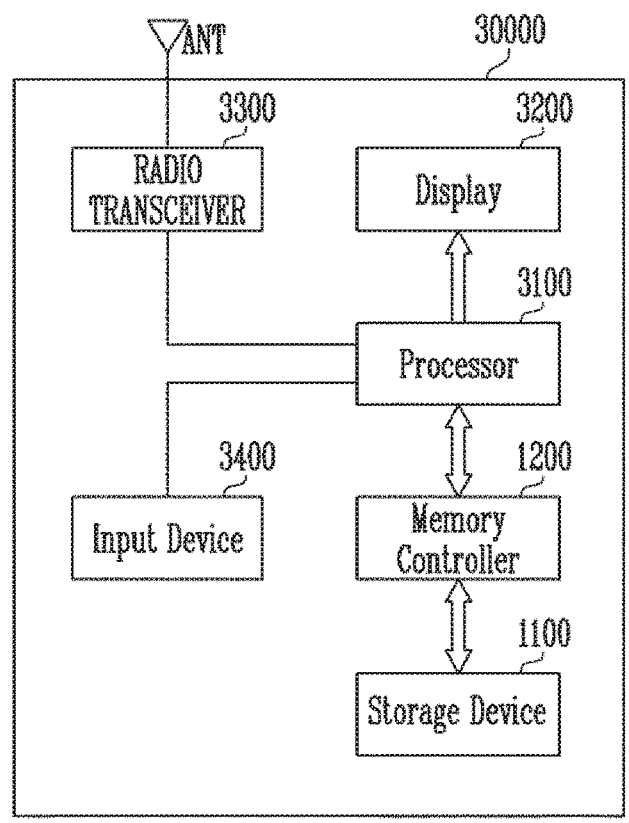
FIG. 15 is a diagram illustrating an example of the memory system having a storage device and a memory controller.

FIG. 15 is a diagram illustrating another embodiment of the memory system having a storage device and a memory controller.

Referring to FIG. 15, the memory system 30000 may be implemented as a cellular phone, a smart phone, a tablet PC, a personal digital assistant (PDA), or a wireless communication device. The memory system 30000 may include a storage device 1100 and a memory controller 1200 capable of controlling an operation of the storage device 1100. The memory controller 1200 may control a data access operation of the storage device 1100, e.g., a program operation, an erase operation, a read operation, or the like under the control of a processor 3100.

Data programmed in the storage device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor storage device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the storage device 1100 may be implemented as a part of the processor 3100. In some embodiments, the memory controller 1200 capable of controlling an operation of the storage device 1100 may be implemented as a chip separate from the processor 3100.

Figure 16:
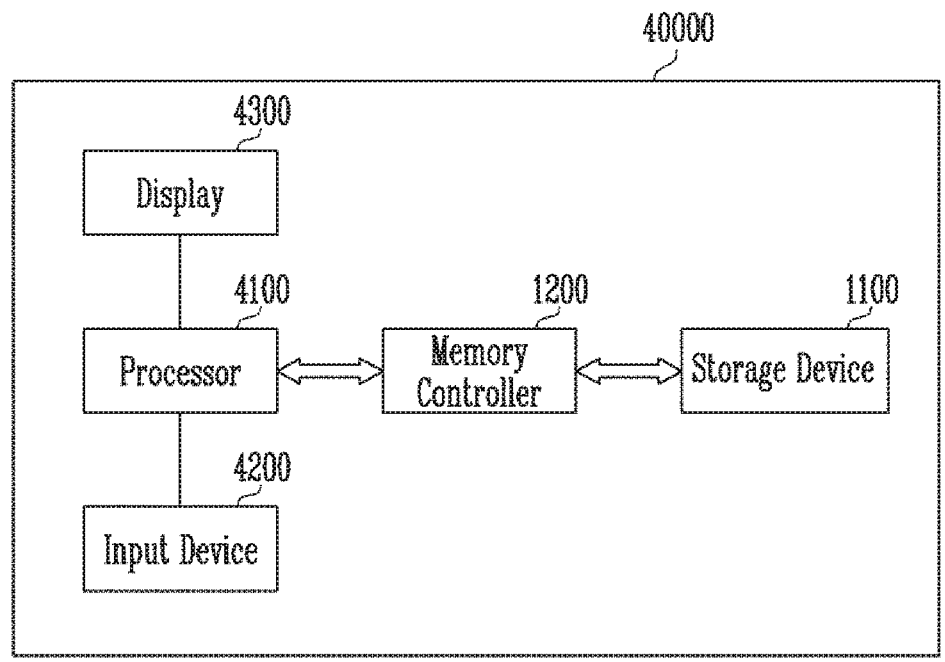
FIG. 16 is a diagram illustrating an example of the memory system having the storage device and the memory controller.

FIG. 16 is a diagram illustrating another embodiment of the memory system having the storage device and the memory controller.

Referring to FIG. 16, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a storage device 1100 and a memory controller 1200 capable of controlling a data processing operation of the storage device 1100.

A processor 4100 may output data stored in the storage device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the storage device 1100 may be implemented as a part of the processor 4100. In some embodiments, the memory controller 1200 capable of controlling an operation of the storage device 1100 may be implemented as a chip separate from the processor 4100.

Figure 17:
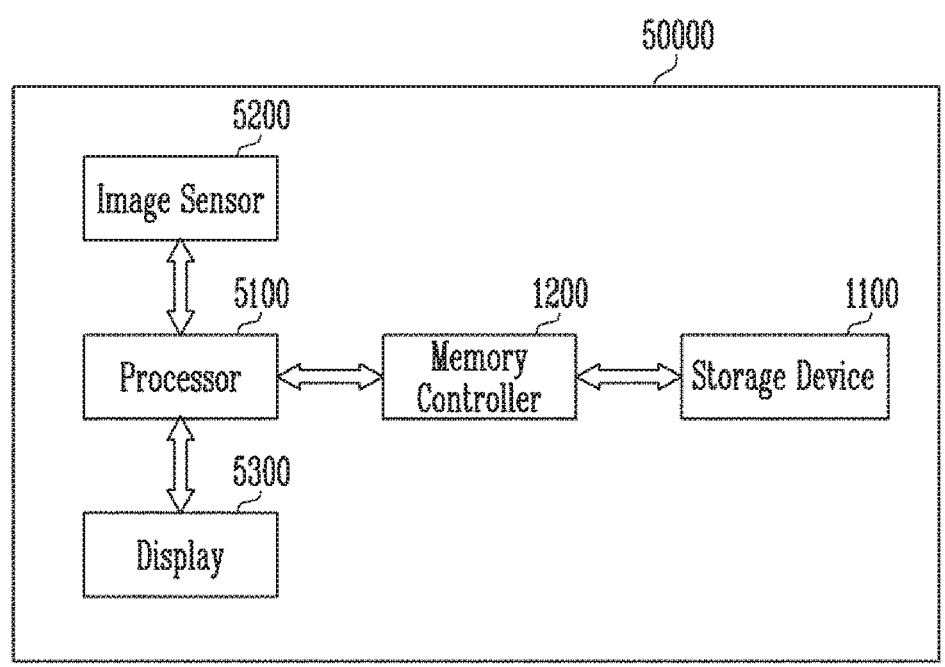
FIG. 17 is a diagram illustrating an example of the memory system having the storage device and the memory controller.

FIG. 17 is a diagram illustrating another embodiment of the memory system having the storage device and the memory controller.

Referring to FIG. 17, the memory system 50000 may be implemented as an image processing device, e.g., a digital camera, a smart phone having a digital camera attached thereto, or a tablet PC having a digital camera attached thereto.

The memory system 50000 may include a storage device 1100 and a memory controller 1200 capable of controlling a data processing operation of the storage device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the storage device 1100 through the memory controller 1200. In addition, data stored in the storage device 1100 may be output through the display 5300 under the control of the processor 5100 or the memory controller 1200.

In some embodiments, the memory controller 1200 capable of controlling an operation of the storage device 1100 may be implemented as a part of the processor 5100. In some embodiments, the memory controller 1200 capable of controlling an operation of the storage device 1100 may be implemented as a chip separate from the processor 5100.

Figure 18:
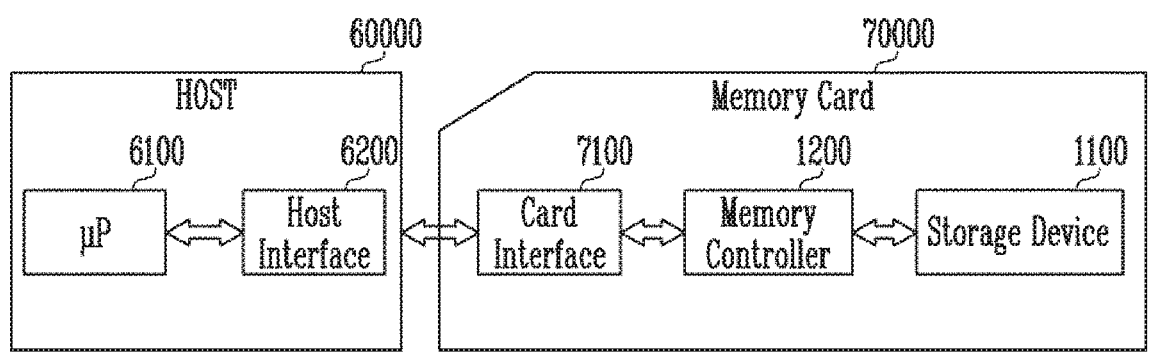
FIG. 18 is a diagram illustrating an example of the memory system having the storage device and the memory controller.

FIG. 18 is a diagram illustrating another embodiment of the memory system having the storage device and the memory controller.

Referring to FIG. 18, the memory system 70000 may be implemented as a memory card or a smart card. The memory system 70000 may include a storage device 1100, a memory controller 1200, and a card interface 7100.

The memory controller 1200 may control data exchange between the storage device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the storage device 1100 through the card interface 7100 and the memory controller 1200 under the control of a microprocessor (μP) 6100.

In accordance with the present disclosure, a program disturb of memory cells can be suppressed. Accordingly, the reliability of the storage device and the reliability of the memory system having the storage device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the present disclosure as set forth in the following claims.

What is claimed is:

1. A memory system comprising:
   a storage device including a plurality of pages for storing data; and
   a memory controller configured to determine, when sudden power-off occurs, whether there is a high probability of a program disturb of unselected pages sharing a word line coupled to a selected page among the pages in rebooting, and output a command to perform an over-write operation for programming data in the selected page or skip the over-write operation, based on a result of the determination.

2. The memory system of claim 1, wherein the memory controller:
   determines whether a page, of which program operation is being performed when the sudden power-off occurs, exists among the pages; and
   determines, when the page, of which program operation is being performed when the sudden power-off occurs, exists, the high probability of the program disturb of the unselected pages.

3. The memory system of claim 1, wherein the memory controller includes:
   a central processor unit configured to determine the high probability of the program disturb of the unselected pages, and output the command, based on a result of the determination; and
   an error correction circuit configured to count an error bit number by detecting an error of data read from the storage device.

4. The memory system of claim 3, wherein the central processor unit includes:
   an operation detector configured to determine the high probability of the program disturb of the unselected pages, and output a signal, based on the determination result; and
   a command generator configured to output the command in response to the signal.

5. The memory system of claim 4, wherein the operation detector:
   preferentially outputs, when a rebooting operation is started after the sudden power-off, a recovery signal; and
   outputs, when a status result value is received from the storage device, a determination signal, according to the status result value.

6. The memory system of claim 5, wherein the operation detector outputs any one of the recovery signal and the determination signal.

7. The memory system of claim 4, wherein the command generator outputs, in response to the signal output from the operation detector, a read command for performing a read operation of the unselected pages; an over-write command for performing the over-write operation of the selected page; or an over-write skip command for skipping the over-write operation.

8. The memory system of claim 7, wherein the storage device includes:
   a command detector configured to output a read signal, an over-write signal or an over-write skip signal in response to the read command, the over-write command or the over-write skip command;
   a read operation manager configured to output control signals for performing the read operation in response to the read signal;

an over-write operation manager configured to output the control signals for performing the over-write operation in response to the over-write signal; and an over-write skip operation manager configured to output the control signals for skipping the over-write operation in response to the over-write skip signal.

9. The memory system of claim 8, wherein, when the over-write skip command is input, the storage device newly selects a page different from the selected page, and outputs the control signals such that the over-write operation is performed on the newly selected page.

10. A method for operating a memory system, the method comprising:

performing rebooting after sudden power-off;

determining, in the rebooting, whether there is a high probability of a program disturb of unselected pages coupled to the same word line as a selected page;

performing, when it is determined that there is not the high probability of the program disturb, an over-write operation of writing data in the selected page; and skipping, when it is determined that there is the high probability of the program disturb, the over-write operation of the selected page.

11. The method of claim 10, wherein the determining is performed based on data read in a read operation of memory cells included in the unselected pages or according to a number of over-write operations performed in the selected page.

12. The method of claim 11, wherein the read operation is performed on all the memory cells, a portion of the memory cells or memory cells programmed to the highest program status among the memory cells.

13. The method of claim 12, wherein, the read operation is performed on all the memory cells for all program statuses that the memory cells are to have.

14. The method of claim 12, wherein, the read operation is performed on a portion of the memory cells for partial program statuses that the memory cells are to have.

15. The method of claim 11, wherein the read operation is performed using, as a read voltage, a voltage higher than a highest voltage of a selected threshold voltage distribution among threshold voltage distributions that memory cells included in the unselected pages are to have.

16. The method of claim 10, wherein the skipping includes:

newly selecting a page different from the selected page; and performing the over-write operation on the newly selected page.

17. The method of claim 11, wherein the determining includes:

determining, when the number of over-write operations performed on the selected page is larger than or equal to a reference number, that there is the high probability of the program disturb in the unselected pages; and determining when the number of over-write operations performed on the selected page is smaller than the reference number, that there is not the high probability of the program disturb in the unselected pages.

18. A method for operating a memory system, the method comprising:

performing rebooting after sudden power-off;

determining, in the rebooting, whether there is a high probability of a program disturb of unselected pages coupled to the same word line as a selected page according to a number of over-write operations performed on the selected page;

performing, when it is determined that there is not the high probability of the program disturb, the over-write operation on the selected page; and newly selecting, when it is determined that there is the high probability of the program disturb, a page different from the selected page, and performing the over-write operation on the newly selected page.

19. The method of claim 18, wherein the determining includes, when the number of over-write operations performed on the selected page is larger than or equal to a reference number, determining that there is the high probability of the program disturb in the unselected pages.

20. The method of claim 19, wherein the determining includes, when the number of over-write operations performed on the selected page is smaller than a reference number, determining that there is not the high probability of the program disturb in the unselected pages.

21. A memory system comprising:

a memory device including a plurality of pages; and a memory controller configured to control, when a write operation is interrupted to a first page among the pages due to a sudden power off, the memory device to perform an over-write operation to a second page, wherein the second page has neighboring pages sharing a word line therewith and the neighboring pages have a low probability of a program disturb, and wherein the memory controller selects a candidate page as the second page based on a result of a read operation to neighboring pages of the candidate page or based on a number of the over-write operations previously performed to the candidate page among the pages.

* * * * *